(12) United States Patent
Zhang et al.

(10) Patent No.: US 8,274,760 B1
(45) Date of Patent: Sep. 25, 2012

(54) SUSPENSION ASSEMBLY INCLUDING A FLEXURE TAIL WITH STAGGERED ROWS OF APERTURES

(75) Inventors: Yiduo Zhang, Cupertino, CA (US); Tzong-Shii Pan, San Jose, CA (US); Yih-Jen D. Chen, Fremont, CA (US); William D. Huber, Hollister, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/471,777

(22) Filed: May 15, 2012

Related U.S. Application Data

(62) Division of application No. 12/126,845, filed on May 23, 2008, now Pat. No. 8,194,354.

(51) Int. Cl.
*G11B 5/48* (2006.01)
*G11B 21/16* (2006.01)

(52) U.S. Cl. ..................... 360/245.9; 360/246

(58) Field of Classification Search ........... 360/244–246
See application file for complete search history.

(56) References Cited

U.S. PATENT DOCUMENTS

| | | | |
|---|---|---|---|
| 5,227,937 A | 7/1993 | Magnusson et al. | |
| 5,608,591 A | 3/1997 | Klaassen | |
| 5,699,211 A | 12/1997 | Magnusson et al. | |
| 5,737,152 A | 4/1998 | Balakrishnan | |
| 5,771,568 A | 6/1998 | Gustafson | |
| 5,812,344 A | 9/1998 | Balakrishnan | |
| 6,249,404 B1 | 6/2001 | Doundakov et al. | |
| 6,424,500 B1 | 7/2002 | Coon et al. | |
| 6,493,190 B1 | 12/2002 | Coon | |
| 6,891,700 B2 | 5/2005 | Shiraishi et al. | |
| 6,900,967 B1 | 5/2005 | Coon et al. | |
| 7,408,744 B1 | 8/2008 | Cuevas | |
| 2004/0027725 A1 | 2/2004 | Pan et al. | |
| 2006/0152854 A1 | 7/2006 | Arya et al. | |
| 2006/0158785 A1 | 7/2006 | Arya et al. | |

OTHER PUBLICATIONS

Office Action dated Apr. 27, 2011 from U.S. Appl. No. 12/126,845, 11 pages.
Notice of Allowance dated Feb. 6, 2012 from U.S. Appl. No. 12/126,845, 7 pages.

*Primary Examiner* — Craig A. Renner
*Assistant Examiner* — Gustavo Polo

(57) ABSTRACT

Disclosed herein are embodiments directed to a head gimbal assembly including a novel suspension assembly that includes a flexure tail with a first plurality of apertures in its structural layer. Each of the first plurality of apertures underlies a first trace but not a second trace. Each of a second plurality of apertures in the structural layer underlies a second trace but not the first trace. Each of the first plurality of apertures includes a corresponding region of maximum width, and each of the second plurality of apertures includes a corresponding region of maximum width, as measured in the width direction. None of the corresponding regions of maximum width of the first plurality of apertures is disposed in an overlapping position along the long axis as any of the corresponding regions of maximum width of the second plurality of apertures.

3 Claims, 5 Drawing Sheets

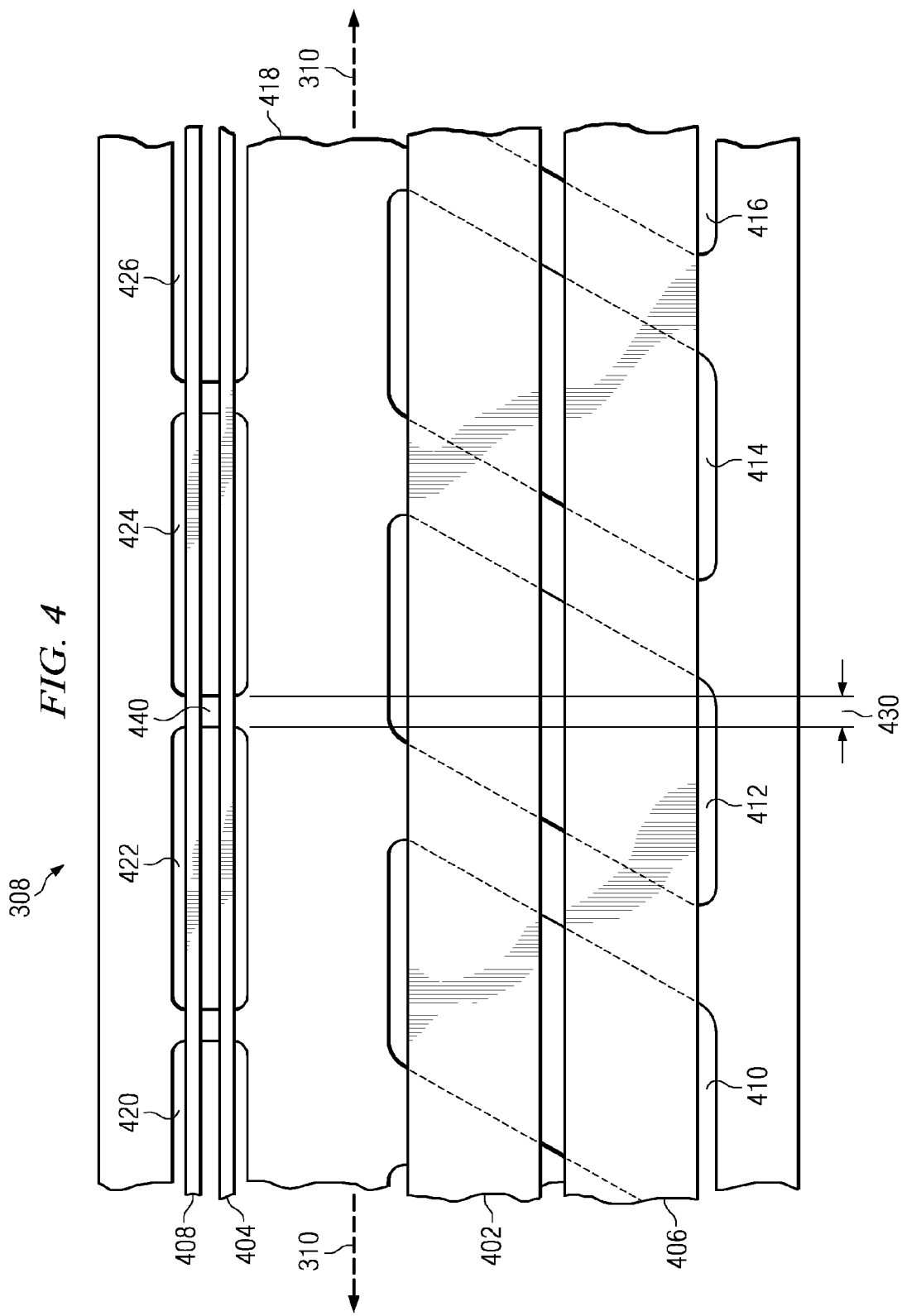

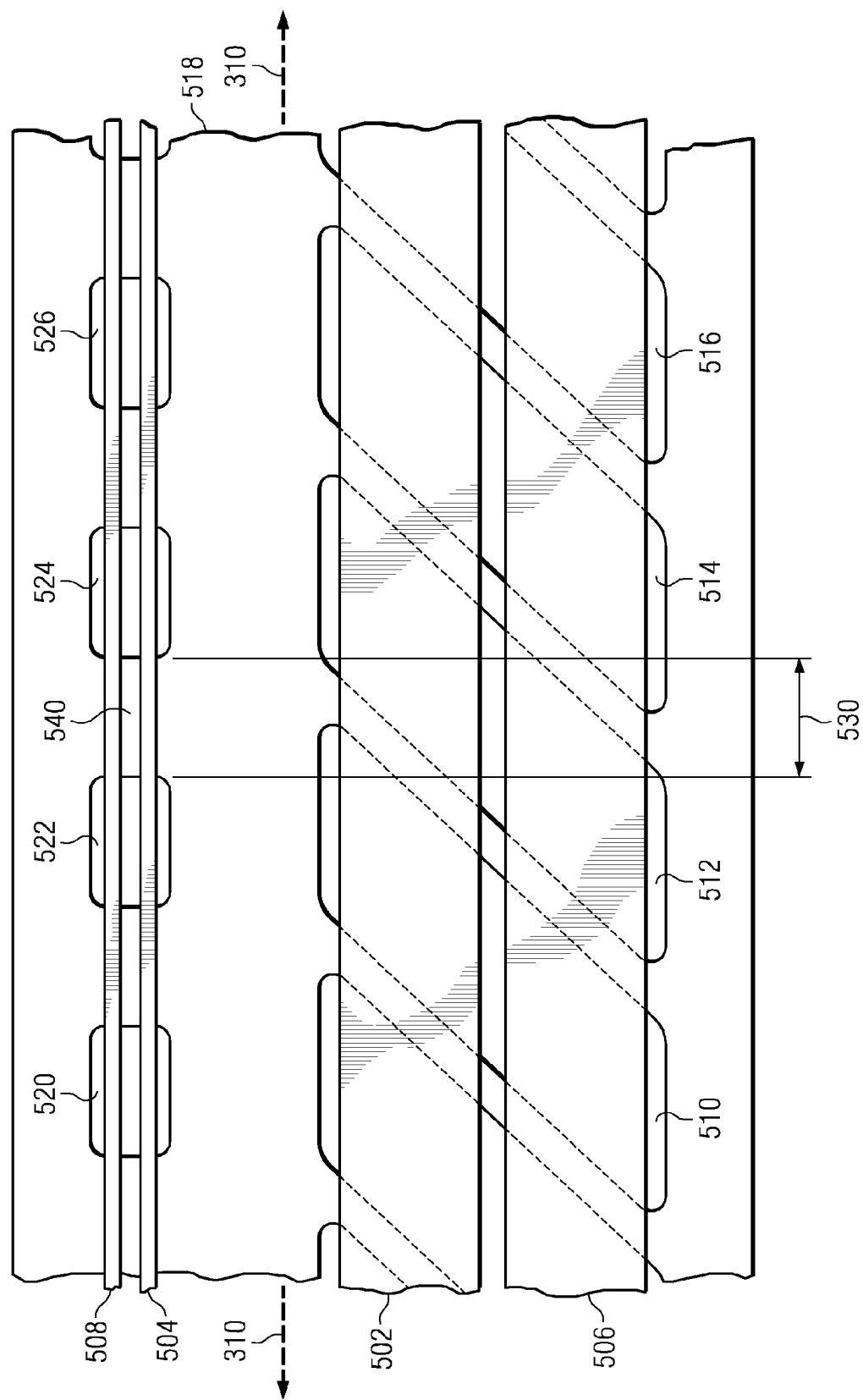

SUSPENSION ASSEMBLY INCLUDING A FLEXURE TAIL WITH STAGGERED ROWS OF APERTURES

CROSS-REFERENCE TO RELATED APPLICATIONS

This application is a divisional of U.S. patent application Ser. No. 12/126,845, filed on May 23, 2008, which is hereby incorporated by reference in its entirety.

BACKGROUND OF THE INVENTION

1. Field of the Invention

The present invention relates generally to the field of information storage devices, and more particularly to suspension assemblies used in head gimbal assemblies of such devices.

2. Background of the Art

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head gimbal assembly (HGA) that typically includes a suspension assembly with a laminated flexure to carry the electrical signals to and from the head. The HGA, in turn, is a sub-component of a head stack assembly (HSA) that typically includes a plurality of HGAs, an actuator, and a flex cable. The plurality of HGAs are attached to various arms of the actuator, and each of the laminated flexures of the HGAs has a flexure tail that is electrically connected to the HSA's flex cable.

Modern laminated flexures typically include conductive copper traces that are isolated from a stainless steel structural layer by a polyimide dielectric layer. So that the signals from/to the head can reach the flex cable on the actuator body, each HGA flexure includes a flexure tail that extends away from the head along the actuator arm and ultimately attaches to the flex cable adjacent the actuator body. That is, the flexure includes traces that extend from adjacent the head and terminate at electrical connection points at the flexure tail. The flex cable includes electrical conduits that correspond to the electrical connection points of the flexure tail.

Since the conductive traces are separated from the structural layer by a dielectric layer, electrical capacitance exists between the conductive traces and the structural layer, and this affects the capacitive reactance and impedance of the conductive traces. Since the dielectric layer is most practically of nearly constant thickness, the most practical way to control or change the capacitance between the conductive traces and the structural layer is to control or change the area of overlap, which can be done by etching apertures/windows into the underlying structural layer. However such apertures in the structural layer also affect the structural characteristics of the flexure tail (e.g. flexure tail stiffness, stress concentration regions, yielding, and strength). Therefore, there is a need in the art for an aperture arrangement for the structural layer in flexure tails that may allow impedance control while limiting adverse consequences on the structural characteristics of the flexure tail.

SUMMARY

A novel suspension assembly includes a load beam and a laminated flexure attached to the load beam. The laminated flexure includes a flexure tongue including a head mounting surface, and a flexure tail. The flexure tail defines a long axis and a width direction that is normal to the long axis. The flexure tail includes a structural layer, a dielectric layer overlying the structural layer, and a plurality of conductive traces overlying the dielectric layer. The flexure tail includes a first plurality of apertures in the structural layer. Each of the first plurality of apertures underlies a first trace but not a second trace. The flexure tail also includes a second plurality of apertures in the structural layer. Each of the second plurality of apertures underlies the second trace but not the first trace. Each of the first plurality of apertures includes a corresponding region of maximum width, as measured in the width direction. Each of the second plurality of apertures includes a corresponding region of maximum width, as measured in the width direction. None of the corresponding regions of maximum width of the first plurality of apertures is disposed in an overlapping position along the long axis as any of the corresponding regions of maximum width of the second plurality of apertures. The novel suspension assembly may be used in a head gimbal assembly of a disk drive.

BRIEF DESCRIPTION OF DRAWINGS

FIG. 4 is a close up view of a portion of the suspension assembly of FIG. 3, according to an embodiment of the present invention.

FIG. 5 is a close up view in the same location as FIG. 4, except according to another embodiment of the present invention.

DETAILED DESCRIPTION OF EXEMPLARY EMBODIMENTS

Figure 1:
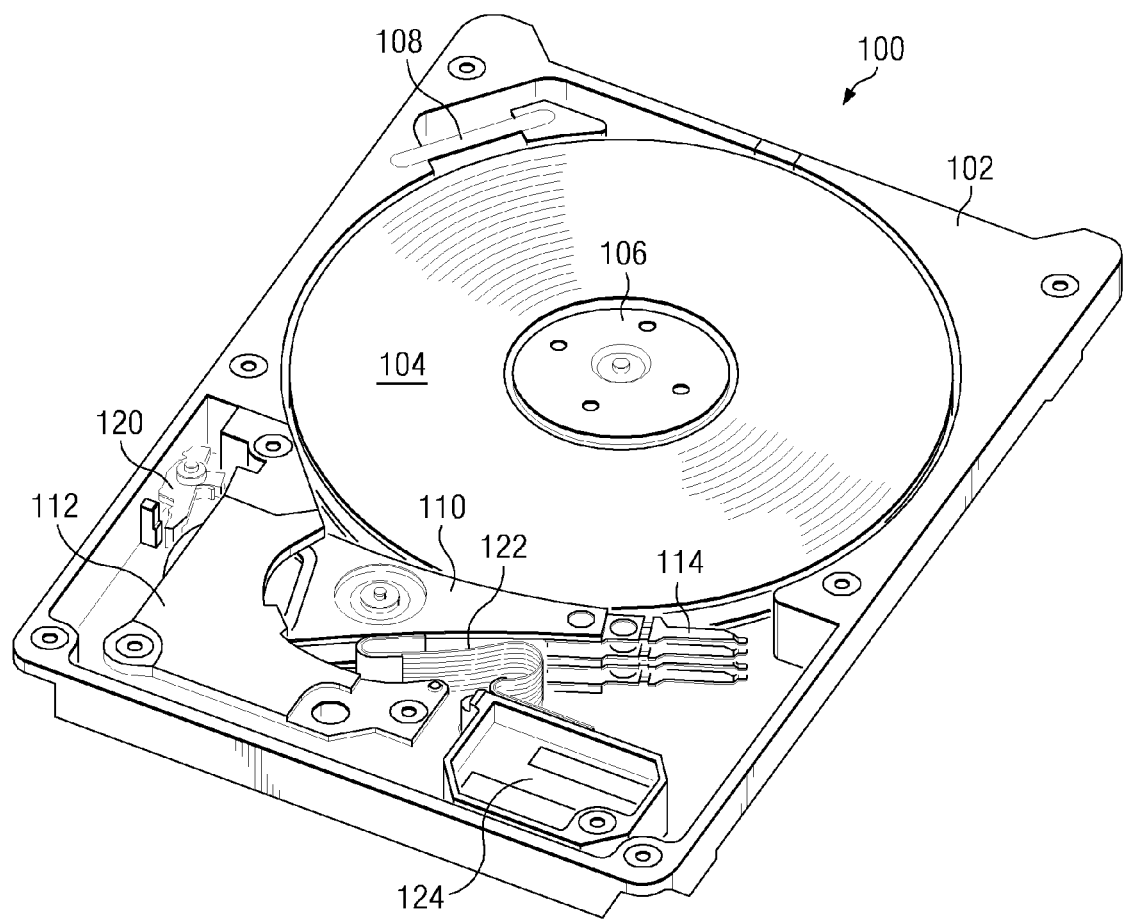
FIG. 1 is top perspective view of a disk drive capable of including an embodiment of the present invention.
Figure 2:
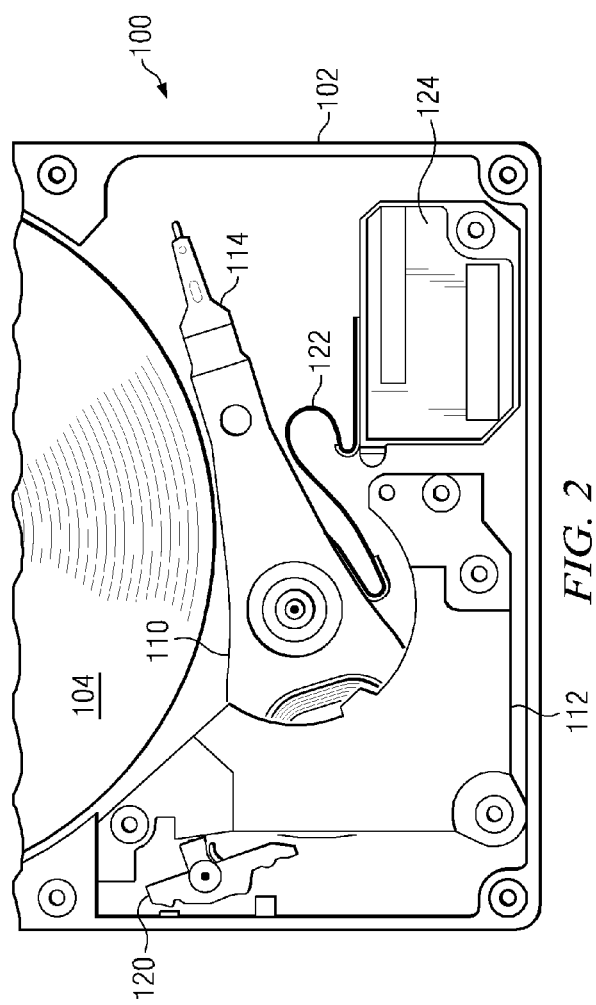
FIG. 2 is a top view of a portion of the disk drive of FIG. 1.

FIG. 1 is top perspective view of a disk drive 100 capable of including an embodiment of the present invention, and FIG. 2 is a top view of a portion of the disk drive 100. The disk drive 100 includes a disk drive base 102 and two annular magnetic disks 104. The disk drive 100 further includes a spindle 106, rotably mounted on the disk drive base 102, for rotating the disks 104. The rotation of the disks 104 establishes air flow through recirculation filter 108. In other embodiments, disk drive 100 may have only a single disk, or alternatively, more than two disks.

The disk drive 100 further includes an actuator 110 that is rotably mounted on disk drive base 102. Voice coil motor 112 rotates the actuator 110 through a limited angular range so that at least one head gimbal assembly (HGA) is desirably positioned relative to one or more tracks of information on a corresponding one of the disks 104. The embodiment of FIG. 1 includes four HGAs 114, each of which corresponds to a surface of one of the two disks 104. However in other embodiments fewer or more HGAs may be included depending on the number of disks 114 that are included and whether the disk drive 100 is depopulated. Each HGA 114 includes a head (not depicted in FIGS. 1 and 2) for reading and writing data from and to one of the disks 114. The actuator 110 may occasionally be latched at an extreme angular position within the limited angular range, by latch 120. Electrical signals to/from the HGAs 114 are carried to other drive electronics via a flex cable 122 and flex cable bracket 124.

Figure 3:
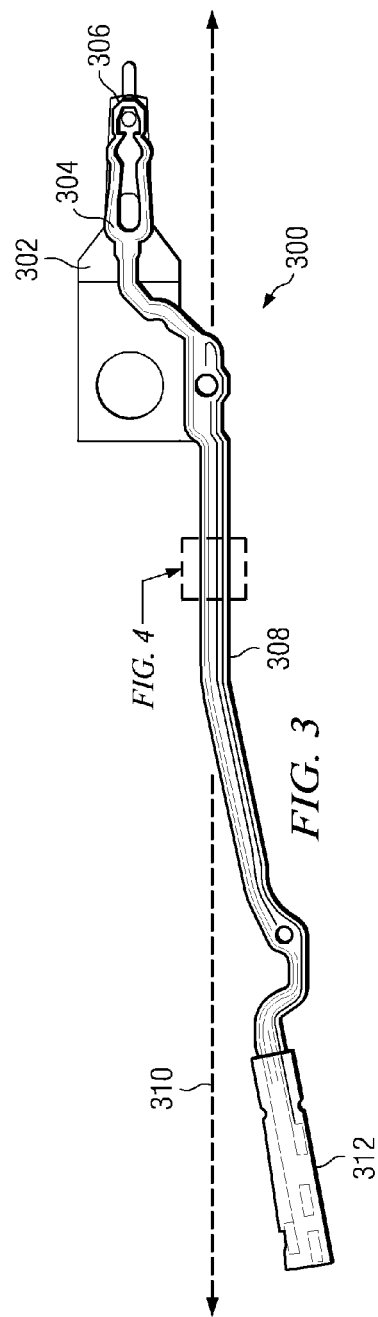
FIG. 3 depicts a suspension assembly capable of including an embodiment of the present invention, with a dashed rectangle indicating the location of the close-up view of FIG. 4.

FIG. 3 depicts a suspension assembly 300 capable of including an embodiment of the present invention, with a dashed rectangle indicating the location of the close-up view of FIG. 4. The suspension assembly 300 is designed to ultimately support a head after it is assembled into a HGA. However, before assembly into an HGA, the suspension assembly 300 does not include a head, and suspension assemblies are commonly manufactured and sold without including a head. The suspension assembly 300 includes a load beam 302. The purpose of the load beam 302, once the suspension assembly 300 is included in a HGA, is to provide vertical compliance for the head to follow vertical undulation of the surface of the disk as it rotates, and to preload the head against the surface of the disk as it rotates, by a preload force that is commonly referred to as the "gram load."

The suspension assembly 300 also includes a laminated flexure 304 attached to the load beam 302. When the suspension assembly 300 is included in a HGA, a head is attached to a head mounting surface of a tongue 306 of the laminated flexure. A first purpose of the laminated flexure 304 is to provide compliance for the head to follow pitch and roll angular undulations of the surface of disk as it rotates, while restricting relative motion between the head and the load beam 302 in the lateral direction and about a yaw axis. A second purpose of the laminated flexure 304 is to provide a plurality of electrical paths to the head to facilitate signal transmission to/from the head.

For that second purpose, the laminated flexure 304 includes a plurality of electrically conductive traces that are isolated from a structural layer by a dielectric layer. For example, the conductive traces may comprise copper, the structural layer may comprise stainless steel and/or another suitable structural material, and the dielectric layer may comprise polyimide. The dielectric layer may overlie the structural layer, and the plurality of conductive traces may overlie the dielectric layer in various regions of the laminated flexure 304. In various other regions of the laminated flexure 304, one or more of the layers may be absent (e.g. removed by etching). Portions of the electrically conductive traces may also be coated with an insulative cover layer (e.g. a polymer layer). So that the signals from/to the head can reach the flex cable 122 adjacent the actuator 110, the laminated flexure 304 includes a flexure tail 308 that extends away from the head along the actuator 110 and ultimately connects to the flex cable 122 adjacent the actuator 110. That is, the laminated flexure 304 includes conductive traces that extend from adjacent the head and terminate at electrical connection points at a terminal region 312 of the flexure tail 308. Methods of electrical connection of the flexure tail 308 to the flex cable 122 include ultrasonic tab bonding, solder reflow, and solder jet bond (SJB).

As seen from FIGS. 1-3, the flexure tail 308 is a distinct and smaller component, as compared with flex cable 122. The flexure tail 308 defines a long axis 310 and a width direction that is normal to the long axis 310.

Now referring to the close-up view of FIG. 4, flexure tail 308 includes a first conductive trace 402 and a second conductive trace 404 (that run parallel to the long axis 310 shown in FIG. 3). Flexure tail 308 also includes a third conductive trace 406 and a fourth conductive trace 408. The first trace 402 may be electrically coupled to a write transducer of the head and the second trace 404 may be electrically coupled to a read transducer of the head, or vice versa, depending on the impedance desired for such electrical paths. Alternatively, there may be a greater number of conductive traces and one or another of the traces may be electrically coupled to another head structure such as a micro-actuator, a transducer heater, etc.

Flexure tail 308 also includes a first plurality of apertures 410, 412, 414, 416 in the structural layer 418. Apertures 410, 412, 414, 416 may also pass through the dielectric layer, but preferably they do not. Each of the first plurality of apertures underlies the first trace 402 and the third trace 406, but not the second trace 404 or the fourth trace 408. Flexure tail 308 also includes a second plurality of apertures 420, 422, 424, 426 in the structural layer 418. Apertures 420, 422, 424, 426 may also pass through the dielectric layer, but preferably they do not. Each of the second plurality of apertures underlies the second trace 404 and the fourth trace 408, but not the first trace 402 or the third trace 406.

Each of the first plurality of apertures includes a corresponding region of maximum width, as measured in the width direction. For example, the region of maximum width of aperture 412 is the region of maximum width 430. It can be verified from FIG. 4 that widths of aperture 412 that are measured in the width direction outside of region of maximum width 430 are less than that which is measured within region of maximum width 430. Similarly, each of the second plurality of apertures includes a corresponding region of maximum width, as measured in the width direction. For example, the region of maximum width of aperture 424 includes nearly all of aperture 424 because aperture 424 is substantially rectangular, excluding only the ends of aperture 424 where its interior corners are filleted.

It can be seen from FIG. 4 that none of the corresponding regions of maximum width of the first plurality of apertures 410, 412, 414, 416 is disposed in an overlapping position along the long axis 310 as any of the corresponding regions of maximum width of the second plurality of apertures 420, 422, 424, 426. For example, the region of maximum width 430 of aperture 412 does not overlap with the regions of maximum width of apertures 422 or 424, but rather falls between them at the location of the web 440 that separates apertures 422 and 424. In certain embodiments it may be desirable for each of the corresponding regions of maximum width of the first plurality of apertures 410, 412, 414, 416, to be disposed at least 10 microns measured along the long axis 310 from any of the corresponding regions of maximum width of the second plurality of apertures 420, 422, 424, 426.

Now referring to the close-up view of FIG. 5, flexure tail 308 includes a first conductive trace 502 and a second conductive trace 504 (that run parallel to the long axis 310 shown in FIG. 3). Flexure tail 308 also includes a third conductive trace 506 and a fourth conductive trace 508. Flexure tail 308 also includes a first plurality of apertures 510, 512, 514, 516 in the structural layer 518. Apertures 510, 512, 514, 516 may also pass through the dielectric layer, but preferably they do not. Each of the first plurality of apertures underlies the first trace 502 and the third trace 506, but not the second trace 504 or the fourth trace 508. Flexure tail 308 also includes a second plurality of apertures 520, 522, 524, 526 in the structural layer 518. Apertures 520, 522, 524, 526 may also pass through the dielectric layer, but preferably they do not. Each of the second plurality of apertures underlies the second trace 504 and the fourth trace 508, but not the first trace 502 or the third trace 506.

Each of the first plurality of apertures includes a corresponding region of maximum width, as measured in the width direction. For example, the region of maximum width of aperture 512 is region of maximum width 530. It can be verified from FIG. 5 that widths of aperture 512 that are measured in the width direction outside of region of maximum width 530 are less than that which is measured within region of maximum width 530. Similarly, each of the second plurality of apertures includes a corresponding region of maximum width, as measured in the width direction. For example, the region of maximum width of aperture 524 includes nearly all of aperture 524 because aperture 524 is substantially rectangular, excluding only the ends of aperture 524 where its interior corners are filleted.

It can be seen from FIG. 5 that none of the corresponding regions of maximum width of the first plurality of apertures 510, 512, 514, 516 is disposed in an overlapping position along the long axis 310 as any of the corresponding regions of maximum width of the second plurality of apertures 520, 522, 524, 526. For example, the region of maximum width 530 of aperture 512 does not overlap with the regions of maximum width of apertures 522 or 524, but rather falls between them at the location of the web 540 that separates apertures 522 and 524. In certain embodiments it may be desirable for each of the corresponding regions of maximum width of the first plurality of apertures 510, 512, 514, 516, to be disposed at least 10 microns measured along the long axis 310 from any of the corresponding regions of maximum width of the second plurality of apertures 520, 522, 524, 526.

Figure 6A:
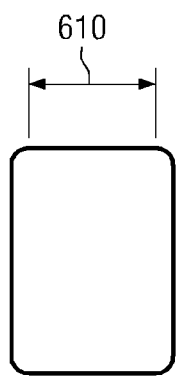
FIGS. 6A, 6B, 6C, and 6D depict a few alternative aperture shapes that might be used in conjunction with an embodiment of the present invention.
Figure 6B:
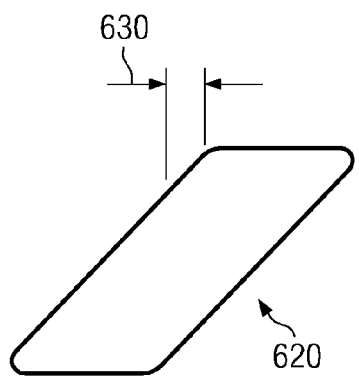
Figure 6C:
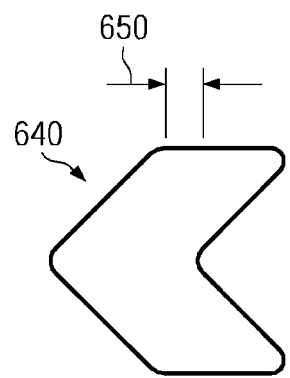
Figure 6D:
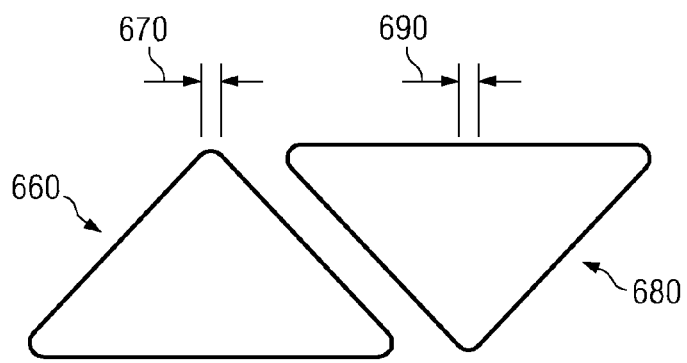

FIGS. 6A, 6B, 6C, and 6D depict a few alternative aperture shapes that might be used in conjunction with an embodiment of the present invention. For example, apertures in either the first and/or second plurality of apertures in the structural layer may be substantially rectangular in shape as shown in FIG. 6A. Also for example, apertures in either the first and/or second plurality of apertures in the structural layer may be substantially triangular in shape, or shaped as a non-rectangular parallelogram as shown in FIG. 6B. Also for example, apertures in either the first and/or second plurality of apertures in the structural layer may take on other shapes such as the chevron shape shown in FIG. 6C or the triangle shapes shown in FIG. 6D. Each shape may be rotated or otherwise oriented, but its region(s) of maximum width are determined by measurement in a direction perpendicular to the long axis 310 of the flexure tail (i.e. the width direction). For example, the aperture 600 in FIG. 6A has a region of maximum width 610 that excludes internally filleted regions. Also for example, the aperture 620 of FIG. 6B has a region of maximum width 630. It can be verified from FIG. 6B that widths of aperture 620 that are measured in the width direction (i.e. vertically on the drawing sheet) outside of region of maximum width 630 are less than that which is measured within region of maximum width 630. Also for example, the aperture 640 of FIG. 6C has a region of maximum width 650. Also for example, the opposing triangular apertures 660 and 680 of FIG. 6D have regions of maximum width 670 and 690, respectively.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. "Comprising," "including," and "having," are intended to be open-ended terms.

What is claimed is:

1. A head gimbal assembly (HGA) comprising:
   a head; and
   a suspension assembly comprising:
   a load beam;
   a laminated flexure attached to the load beam, the laminated flexure including:
   a flexure tongue attached to the head; and
   a flexure tail defining a long axis and a width direction that is normal to the long axis, the flexure tail including:
      a structural layer;
      a dielectric layer overlying the structural layer;
      a plurality of conductive traces overlying the dielectric layer, the plurality of conductive traces including at least a first trace and a second trace;
      a first plurality of apertures in the structural layer, each of the first plurality of apertures underlying the first trace but not the second trace, at least one of the first plurality of apertures being shaped as a non-rectangular parallelogram; and
      a second plurality of apertures in the structural layer, each of the second plurality of apertures underlying the second trace but not the first trace;
   wherein each of the first plurality of apertures includes a corresponding region of maximum width, as measured in the width direction, and each of the second plurality of apertures includes a corresponding region of maximum width, as measured in the width direction, and none of the corresponding regions of maximum width of the first plurality of apertures is disposed in an overlapping position along the long axis as any of the corresponding regions of maximum width of the second plurality of apertures; and
   wherein each of the corresponding regions of maximum width of the first plurality of apertures, is disposed at least 10 microns measured along the long axis from any of the corresponding regions of maximum width of the second plurality of apertures.

2. The HGA of claim 1 wherein the first trace is electrically coupled to a write transducer of the head and the second trace is not.

3. The HGA of claim 2 wherein the second trace is electrically coupled to a read transducer of the head.

* * * * *